United States Patent [19]

Maurice et al.

[11] Patent Number: 4,738,749
[45] Date of Patent: Apr. 19, 1988

[54] PROCESS FOR PRODUCING AN ACTIVE MATRIX DISPLAY SCREEN WITH GATE RESISTANCE

[76] Inventors: Francois Maurice, 125 Boulevard de la Corniche, 22700 Perros Guirec; Joseph Richard, 33 Lotissement Keranroux Ploubezre, 22300 Lannion; Bruno Vinouze, Chemin de la Chapelle, 22710 Port-Blanc, all of France

[21] Appl. No.: 7,084

[22] Filed: Jan. 27, 1987

[30] Foreign Application Priority Data

Jan. 27, 1986 [FR] France .................................. 86 01083

[51] Int. Cl.$^4$ .......................... B44C 1/22; C03C 15/00; C03C 25/06; C23F 1/02
[52] U.S. Cl. .................................... 156/652; 156/653; 156/656; 156/657; 156/659.1; 156/662; 156/667; 350/333; 350/336; 357/2; 357/4; 437/181; 437/189; 437/228
[58] Field of Search ............... 156/652, 653, 656, 657, 156/659.1, 661.1, 662, 667; 29/571, 572, 577, 578, 580, 591; 357/2, 4, 23.7, 40, 49, 71; 350/332, 333, 336; 437/181, 189, 228

[56] References Cited

U.S. PATENT DOCUMENTS

| | | | |
|---|---|---|---|
| 4,624,739 | 11/1986 | Shimbo | 156/643 |
| 4,653,858 | 3/1987 | Szydlo et al. | 350/332 |
| 4,654,117 | 3/1987 | Aoki et al. | 156/659.1 |

Primary Examiner—William A. Powell
Attorney, Agent, or Firm—Oblon, Fisher, Spivak, McClelland & Maier

[57] ABSTRACT

Process for producing an active matrix display screen with gate resistance.

A resistive layer, for example of aSi:n$^+$ is inserted under the gate of the transistors. A short circuit in the insulating layer no longer risks short-circuiting a line and a column.

Application to display.

4 Claims, 4 Drawing Sheets

PROCESS FOR PRODUCING AN ACTIVE MATRIX DISPLAY SCREEN WITH GATE RESISTANCE

This invention has as its object a process for producing an active matrix display screen with gate resistance.

An active matrix display screen generally comprises two plates between which is inserted an electrooptical material such as a liquid crystal. On one of the plates is a matrix of transparent conductive blocks, thin-film transistors, a family of conductive addressing lines and a family of conductive addressing columns. Each transistor has a gate connected to a line, a source connected to a block and a drain connected to a column. On the second plate is a counterelectrode.

Figure 1:
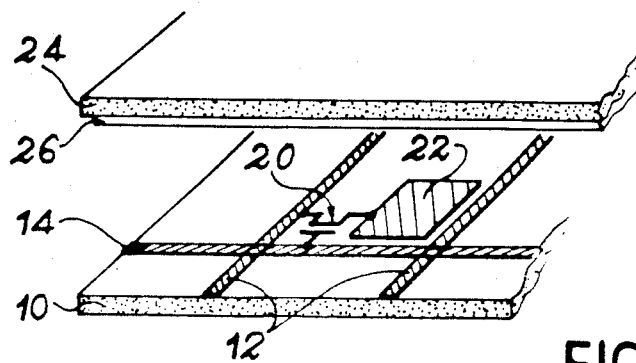

Such a structure is shown in FIG. 1. Represented there in a simplified manner is a lower plate 10 carrying conductive columns 12 and conductive lines 14, transistors 20 and conductive blocks 22, and an upper plate 24 covered with a counterelectrode 26.

Figure 2:
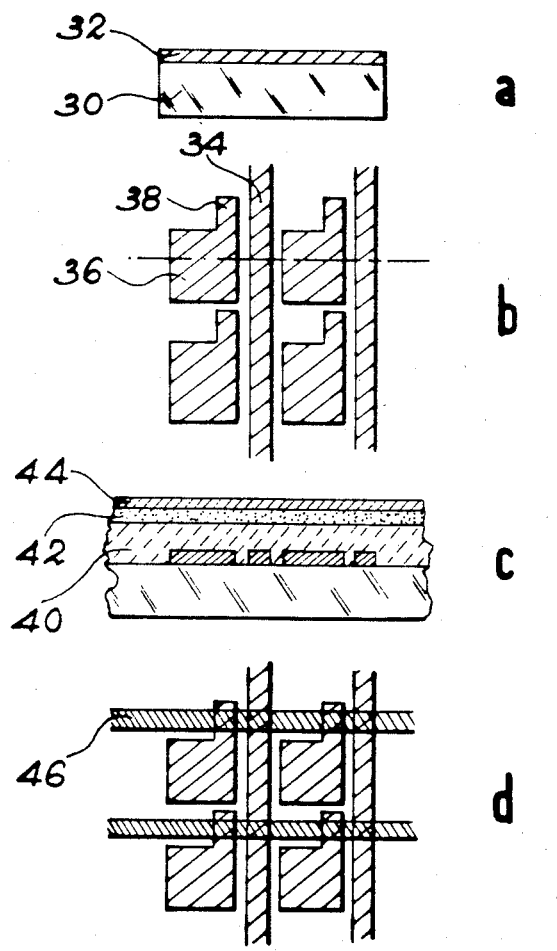

To obtain such a structure, a process can be used whose main stages are illustrated in FIG. 2. This process comprises the following operations:
- preparation of a glass substrate 30 by physicochemical cleaning,
- depositing of a layer 32 of transparent conductive material, for example of indium and tin oxide (ITO) (part a),
- a first photoengraving, to give layer 32 the shape of columns 34 and of blocks 36 provided with a rectangular appendix 38 (part b),
- depositings of a hydrogenated amorphous silicon layer 40, a silica layer 42 and an aluminum layer 44, each depositing being made at about 250° C. (or more if the CVD-plasma technique is used (part c)),
- a second photoengraving, to define lines 46 overlapping appendices 38 and intersecting the columns, which defines the transistors (part d),
- general passivation by depositing of a SiO₂ layer (not shown).

Such a process, with two masking levels, is described in French patent application FR-A-No.2 533 072.

Despite its simplicity, this process exhibits drawbacks:
- first of all, in case of a drain-gate short circuit of a transistor, an entire column is short-circuited with a line,
- then, the width of a line, in the zone where it intersects a column, is determined by the width of the channel of the transistor, so that it cannot be reduced at will to reduce the line-column short-circuit risks,
- finally, the thickness of the insulating material which separates a line and a column, by the very design, like that of the insulating material is located under the gate of the transistor, so that there is no control, there either, of the increase of this thickness if it is desired to reduce the short-circuit risks.

The aim of the invention is precisely to remedy these drawbacks. For this purpose, the invention specifies the use of a layer of resistive material placed under the gate of the transistors. Finally, in case of failure (for example, in case of perforation) of the insulating material of the transistor, there is no complete short circuit between the line and the corresponding column.

Moreover, according to the invention, the drain of the transistor does not consist of the column itself, but of a segment connected to this column. In this way, there is relative independence between the transistors and the line-column intersection zones, so that the thickness of the intersection insulating material can be made greater than that of the insulating material of the transistor.

Figure 3:
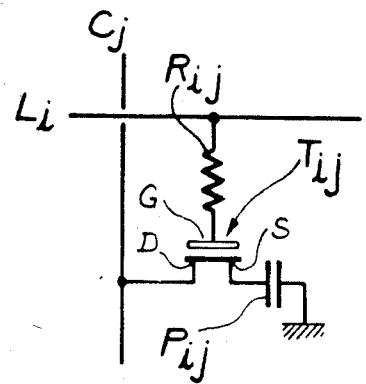
Figure 5:
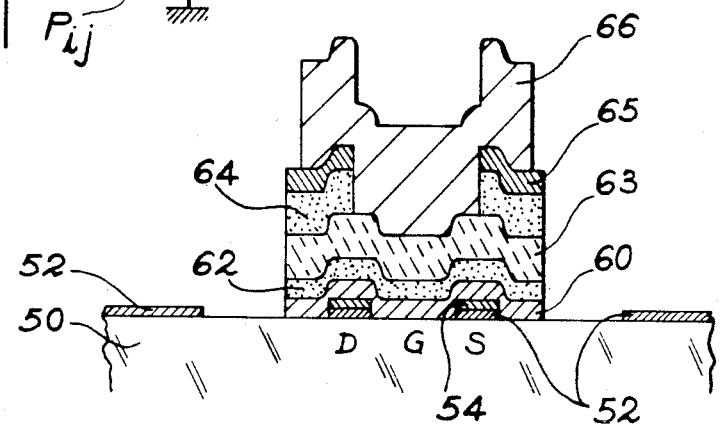
Figure 9:
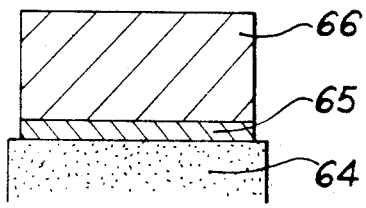
Figure 10:
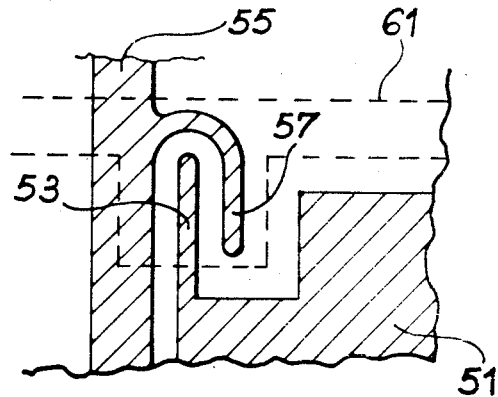
Figure 4:
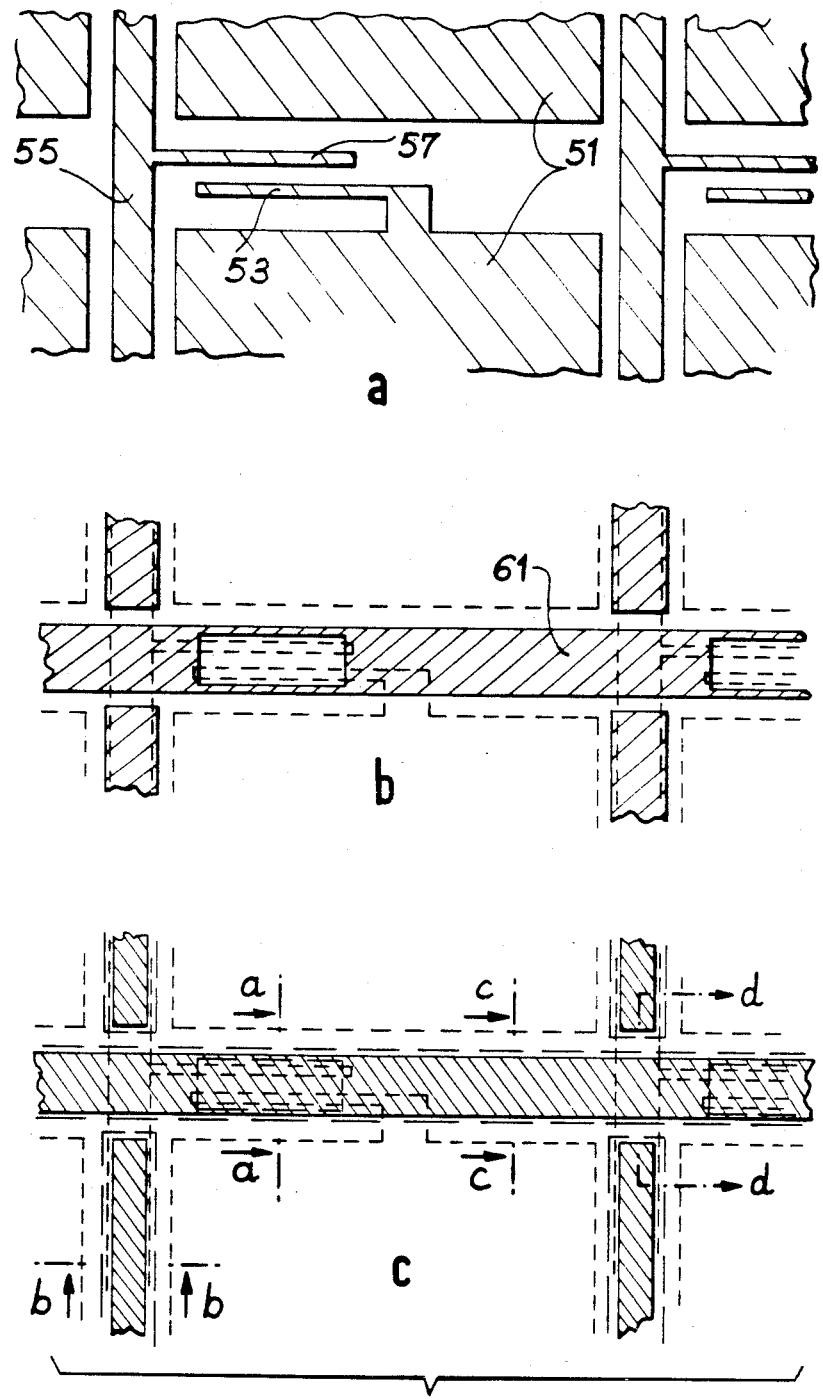
Figure 6:
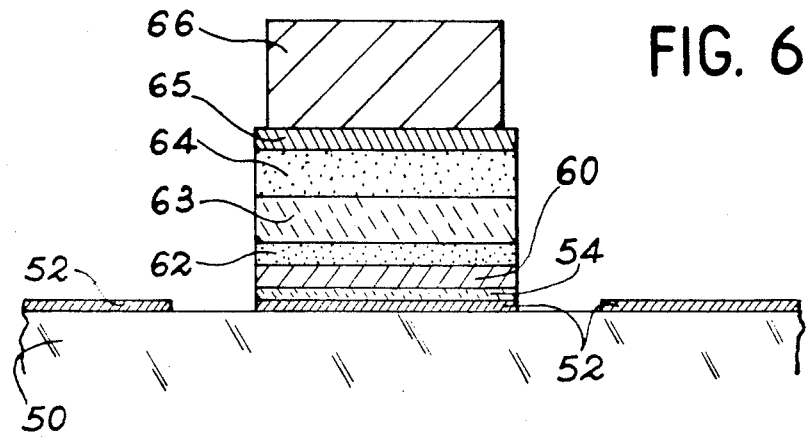
Figure 7:
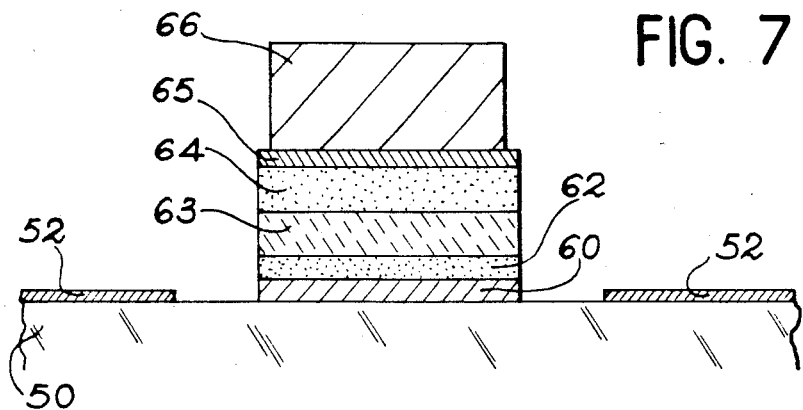
Figure 8:
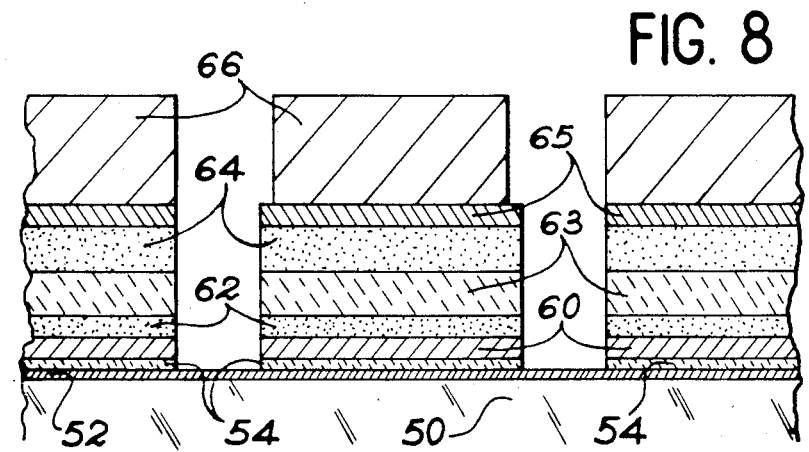

In any case, the characteristics of the invention will come out better on reading the following description of examples of embodiment given by way of explanation and that are in no way limiting. This description refers to the accompanying drawings in which:

FIG. 1, already described, shows the structure of an active matrix display screen, according to the prior art, FIGS. 2(a–d), already described, illustrates a known production process used to produce an active matrix display screen, FIG. 3 shows an equivalent electrical diagram of an element of a display screen according to the invention, FIGS. 4(A–C) shows the main stages of a production process according to the invention using three masking levels, FIG. 5 shows a section obtained in the zone of the channel of a transistor, FIG. 6 shows a section obtained on a column, FIG. 7 shows a section obtained on a line, FIG. 8 shows a section obtained at the intersection of a line and a column, FIG. 9 shows a detail of the two upper metal layers, FIG. 10 illustrates another process for making the display screen of the invention, using only two masking levels.

FIG. 3 represents an equivalent electrical diagram of a display point of a screen according to the invention. Seen there is a display point (or "pixel") Pij formed by a capacitor one of whose capacitor plates is brought to a reference potential and the other connected to a transistor Tij. This latter comprises a gate G, a source S and a drain D. Furthermore, an addressing line Li and an addressing column Cj are seen. Gate G of the transistor is connected to line Li by a resistance Rij, source S to the capacitor, and drain D to column Cj. Value R of the grid resistance must be greater than the output impedance of the circuits for controlling the screen and such that the time constant RC or C designates the capacitance of the gate of the transistor, i.e., much less than the time for scanning a line.

For example, this time T can be 64 μs and C can be equal to $5.10^{-13}$ F. A resistance R in the range going from $10^5$ to $2.10^7 \Omega$ can be used.

To obtain such a resistance, a resistive layer of n highly doped amorphous silicon having a thickness of a tenth of a micron, or more can be used. For a gate of 2 μm by 7 μm, that corresponds to a transverse resistance on the order of $$R = \rho \frac{l}{s} = 1,4.10^4 \frac{10^{-4}}{2 \times 7.10^{-6}} = 10^5 \Omega$$

FIG. 4 shows three stages (parts a, b, c) of a production process having three masking levels. Reference can also be made to FIGS. 6, 7 and 8 which show in section the various deposited layers. The operations performed are as follows:
- depositing on an insulating support 50, of glass for example, a layer 52 of a transparent conductive material, for example of tin and indium oxide ITO, and optionally a layer 54 of n+ doped amorphous silicon, (see in particular FIGS. 6, 7, and 8), a first photoengraving of this layer or these layers to form blocks 51 connected to a segment 53, colomns 55 connected to another segment 57 parallel to the first (part a of FIG. 4), depositing of a stack consisting of a layer 60 of hydrogenated amorphous silicon aSi:H, a layer 62 of a first insulating material (for example of SiO₂), then a layer 63 of n highly doped amorphous silicon (aSin+) constituting the future gate resistance, a layer 64 of a second insulating material, not necessarily identical with the first but able to be identical, and a layer 65 of a first metal (FIGS. 6, 7, 8), a second photoengraving applied to this stack to free the blocks and the zones where the intersections will take place with the lines, but allowing this stack to subsist along lines 61 inserted between the blocks, these lines overlapping the two segments 53 and 57, this second photoengraving allowing this stack to subsist also on the columns, except of course at the place where these columns intersect the lines. This second photoengraving is only partial between the two segments and causes metal layer 65 and that of second insulating material 64 to disappear and thus causes layer 63 of highly doped amorphous silicon, constituting the future gate resistance, to appear; the second engraving level is represented in solid lines in part b of FIG. 4, the first masking level being represented by dashes, depositing of a layer 66 of a second metal, a third photoengraving applied to this final layer so as to allow it to subsist only on the lines, which makes the contact between layer 63 of highly doped amorphous silicon and the lines already formed, this third photoengraving also allowing the second metal to subsist on what remains of first metal 65 on the columns (the parts obtained after this third photoengraving are represented in solid lines in part c of FIG. 4).

A better understanding of the final structure can be obtained by examining FIG. 5, which is a section through the channel of the transistor (section aa of FIG. 4c), FIG. 6, which is a section through a column (section bb), FIG. 7, which is a section through a line (section cc) and FIG. 8 which is a section in the line-column intersection zone (section dd).

It will be observed that the second insulating material 64 exists at the line-column intersection while it is eliminated under the gate of the transistor where only first insulating material 62 is present. Therefore, it will be able to give insulating material 62 the thickness required to assure good performances to the transistor while using a rather thick insulating material 64 to assure the line-column insulation.

In FIGS. 7 and 8, it will be noted that the width of the lines of second metal 66 is less than the width of the lines of first metal 65. This corresponds to the case where these two metals are different and where the first is not attacked by the third photoengraving. If these two metals are identical, the lines will have the same width in the two levels, as indicated in FIG. 9. This common width will be less than that of insulating material 64 which supports them, this to reduce the risks of short circuit by the slice.

When the two metals 65 and 66 are different, the superp sition of these two metal layers produces a redundancy which prevents the risks of line breaking: it is actually almost impossible that these two layers would be broken at the same place.

It will be noted that:

the functioning obtained at the intersection of a line and a column does not depend on the thickness of second insulating material 64, since it correspond only to the thickness of layers 52 and 54 obtained after a first photoengraving, the gate of the transistor is defined by masking; therefore, there is no spurious transistor between the gate and the column as in the prior art, the interface between layer 60 of hydrogenated amorphous silicon and layer 62 of the first insulating material, and the interface between this latter layer and layer 63 of highly doped silicon, never see air.

The process with three masking levels which has just been described is not the only one possible. FIG. 10 illustrates another process which saves one photoengraving. The operations to be accomplished begin, as for the first process, by a depositing, on an insulating substrate, of a layer of a transparent conductor, ITO for example, surmounted by a layer of n doped amorphous silicon. Then a first photoengraving is performed to form blocks 51, with an appendix 53, columns 55 with an appendix 57 (in solid line in FIG. 10). Then, a stack constituted by a layer of hydrogenated amorphous silicon, a layer of a first insulating material, a thick layer of n+ highly doped amorphous silicon (which constitutes the resistive layer) and a metal layer are deposited. In other words, the layer of the second insulating material is no longer deposited, nor the layer of the first metal, but the resistive layer is inserted directly between the metal of the gate and the first insulating material. This stack is the object of a second photoengraving to allow lines 61 and and a gate to subsist above the two appendices 53, 57 (in dashes in FIG. 10).

In comparison with a process having two masking levels such as the one which is described in the document FR-A-2 533 072, the process which has just been described exhibits the following advantages:

a spot short circuit in the insulating material of the transistor is placed in series with the resistance formed by the layer of aSi:n+ and which is on the order of $10^7 \Omega$, so that this failure does not disturb the line or the column at the intersection of which it is located. If the short circuit is on the drain of the transistor, it prevents it from functioning only very locally, the insulating material-gate interface does not see air, the particular shape of appendix 57 eliminates the spuriou transistor which existed between appendix 53 and the following column, a great thickness (greater than 0.3 μm) of aSi:n+ can smooth the functioning at the passage from level 1, which accordingly reduces the breaking risks of the gate metal.

We claim:

1. Process for producing an active matrix display screen, this process consisting in making a lower wall (10) carrying first capacitor plates (22) and thin-film transistors (20), conductive addressing lines (14) and columns (12), and an upper wall (24) coated with a counterelectrode (26) forming a second capacitor plate, this process being characterized by the fact that, to make the lower wall (10), the following operations are performed:

depositing on an insulating substrate (50) of a layer (52) of a first transparent conductive material, optionally surmounted by a layer (54) of n doped amorphous silicon, a first photoengraving to form blocks (51) forming one of the capacitor plates of the future capacitors and columns (55), this first photoengraving allowing to subsist also beside each block two parallel segments (53, 57), one segment (57) constituting the future drain of the transistor and connected to the adjacent column (55) and the other segment (53) constituting the future source of the transistor and connected to the block in question (51), depositing of a stack consisting of a layer (60) of hydrogenated amorphous silicon, a layer (62) of a first insulating material, a layer (63) of n+ highly doped amorphous silicon constituting the future gate resistance, a layer (64) of a second insulating material, a layer (65) of a first metal, a second photoengraving applied to the preceding stack to free the blocks (51) but to allow this stack to subsist along lines inserted between the blocks, these lines overlapping the two parallel segments (53, 57) and to allow this stack to subsist on the columns, except at the place where these columns intersect the lines, this second photoengraving being only partial between the two segments and causing the layer of the first metal (65) of the second insulating material (64) to disappear and causing layer (63) of highly doped amorphous silicon, constituting the future gate resistance, to appear, depositing of a layer of a second metal (66), a third photoengraving applied to this layer of second metal (66) to allow the lines to subsist, which makes the contact between layer (63) of highly doped amorphous silicon and the lines, this third photoengraving also allowing the second metal to subsist on what remains of the first metal on the columns.

2. Process according to claim 1, wherein the first metal (65) and the second metal (66) are different, the width of the strips of the second metal (66) which subsist after the third engraving being smaller than the width of the strips of the first metal (65) which subsist after the second photoengraving.

3. Process according to claim 1, wherein the first metal (65) and the second metal (66) are identical and the strips of these metals which subsist after the second and third photoengravings have the same width, the latter being less than the width of the strips of the second insulating material (64) which subsist after a second photoengraving.

4. Process for producing an active matrix display screen, this process consisting in making a lower wall (10) carrying first capacitor plates (22) and thin-film transistors (20), conductive addressing lines (14) and columns (12), and an upper wall (24) coated with a counterelectrode (20) forming a second capacitor plate, this process being characterized by the fact that, to make the lower wall (10), the following operations are performed:

depositing on an insulating substrate (50) of a layer (52) of a first transparent conductive material, optionally surmounted by a layer (54) of n doped amorphous silicon, a first photoengraving to form blocks (51) forming one of the capacitor plates of the future capacitors, columns (55) and two parallel segments (53, 57), one segment (57) constituting the future drain of the transistor and connected to the adjacent column (55) and the other segment (53) constituting the future source of the transistor and connected to the block (51), depositing of a stack consisting of a layer (60) of hydrogenated amorphous silicon, a layer (62) of a first insulating material, a layer (63) of n+ highly doped amorphous silicon constituting the future gate resistance, and a metal layer (66), a second photoengraving applied to the preceding stack to allow lines (61) and gates to subsist above the two parallel segments (53, 57).

* * * * *